United States Patent [19]

Hall

[11] Patent Number: 4,566,914
[45] Date of Patent: Jan. 28, 1986

[54] METHOD OF FORMING LOCALIZED EPITAXY AND DEVICES FORMED THEREIN

[75] Inventor: John H. Hall, San Jose, Calif.

[73] Assignee: Micro Power Systems, Inc., Santa Clara, Calif.

[21] Appl. No.: 494,124

[22] Filed: May 13, 1983

[51] Int. Cl.[4] ............ H01L 21/20; H01L 21/265
[52] U.S. Cl. .................... 148/1.5; 29/576 E; 29/576 W; 29/578; 148/175; 148/187; 357/42; 357/91
[58] Field of Search ............ 148/1.5, 187, 175; 29/578, 576 W, 576 E; 357/42, 91

[56] References Cited

U.S. PATENT DOCUMENTS

| | | | |
|---|---|---|---|
| 4,101,350 | 7/1978 | Possley et al. | 148/175 |
| 4,269,631 | 5/1981 | Anantha et al. | 148/1.5 |
| 4,375,993 | 3/1983 | Mori et al. | 148/1.5 |
| 4,381,201 | 4/1983 | Sakurai | 148/1.5 |
| 4,381,202 | 4/1983 | Mori et al. | 148/1.5 |
| 4,395,433 | 7/1983 | Nagakubo et al. | 29/576 E |
| 4,400,411 | 8/1983 | Yuan et al. | 29/576 W |
| 4,461,670 | 7/1984 | Celler et al. | 427/53.1 |
| 4,487,639 | 12/1984 | Lam et al. | 148/175 |
| 4,498,226 | 2/1985 | Inoue et al. | 29/576 B |
| 4,499,657 | 2/1985 | Ooga et al. | 29/578 |

OTHER PUBLICATIONS

Miyao et al. in "Laser-Solid Interactions and Transient Thermal Processing of Materials," ed. Narayan et al., North-Holland, N.Y., Nov. 1982, p. 499.

*Primary Examiner*—Upendra Roy
*Attorney, Agent, or Firm*—Flehr, Hohbach, Test, Albritton & Herbert

[57] ABSTRACT

An integrated circuit structure for isolating circuit structures in closely packed integrated circuits, and a method for making the same. The isolation structure includes a semiconductor body having a surface, an insulatory layer on the surface having an aperture and an offset adjacent to the aperture, the aperture and offset being filled with epitaxial semiconductor material, at least a portion of the epitaxial material being single crystal semiconductor, said structure being used for the fabrication of standard semiconductor devices. The method uses conventional processing techniques that require a minimum of additional cost over prior art, and yet provide a high degree of device isolation and density.

12 Claims, 14 Drawing Figures

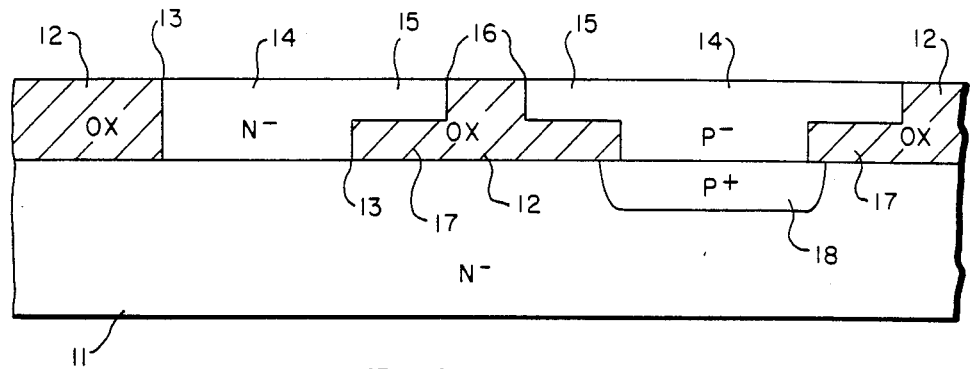
FIG.—1
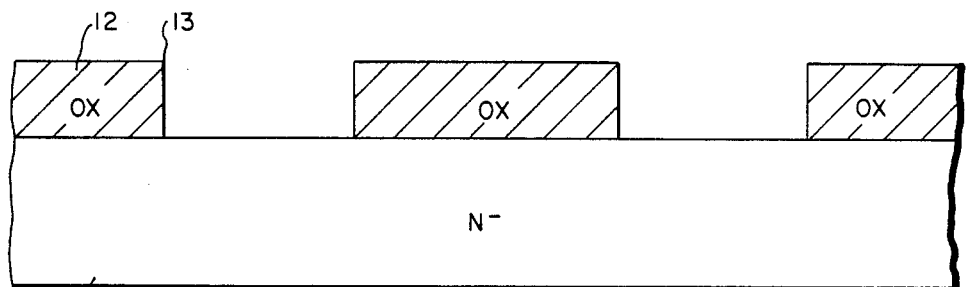
FIG.—2a
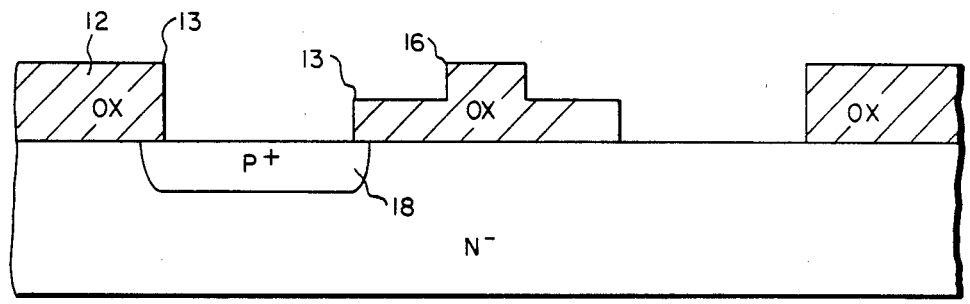
FIG.—2b
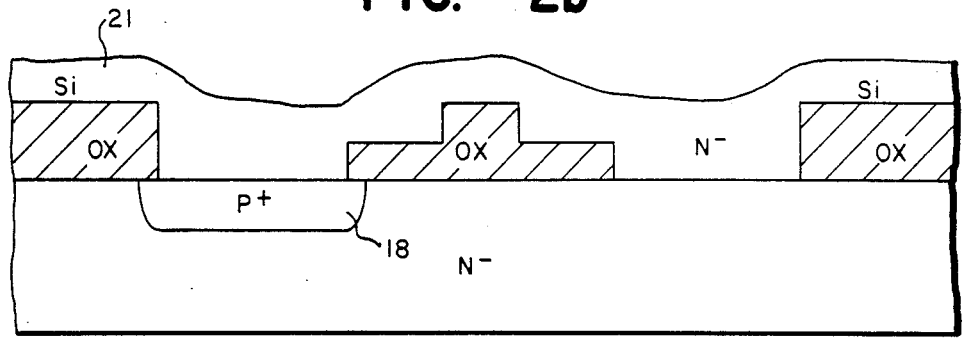
FIG.—2c

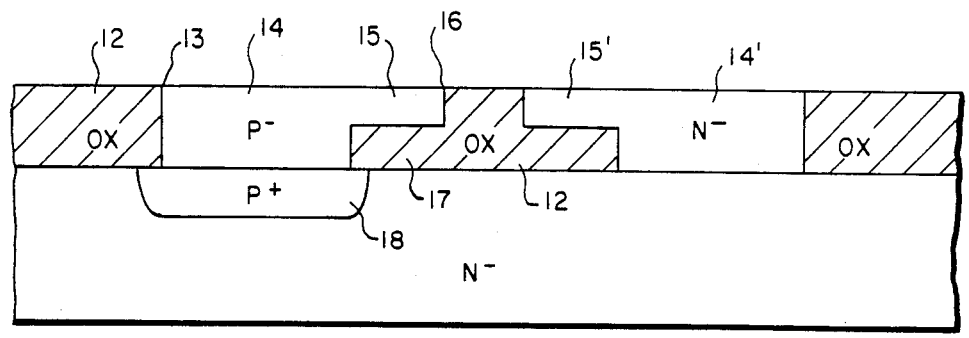
FIG. —2d
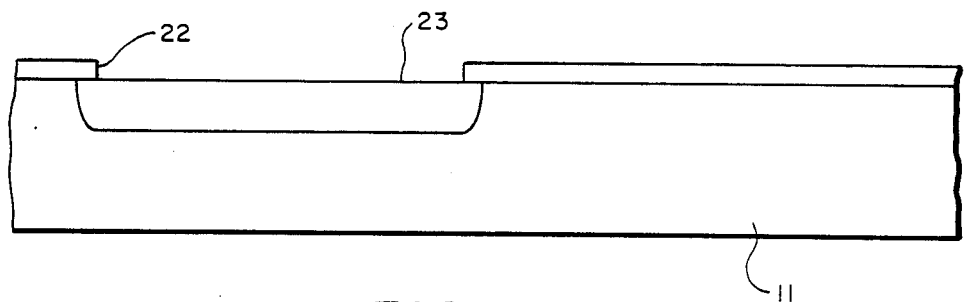
FIG. —2e
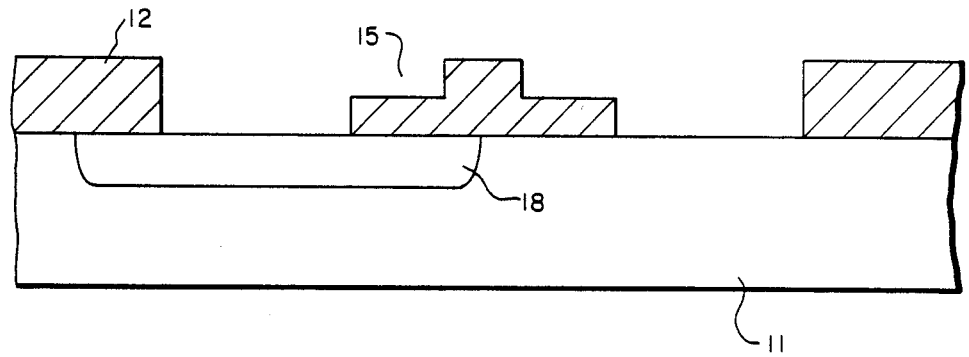
FIG. —2f

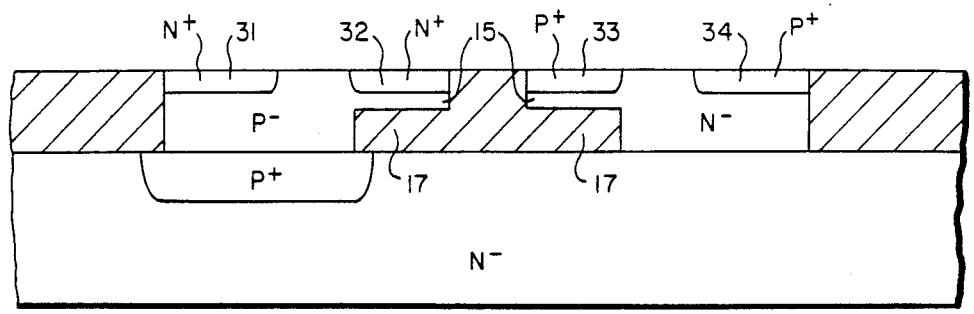
FIG.—3a
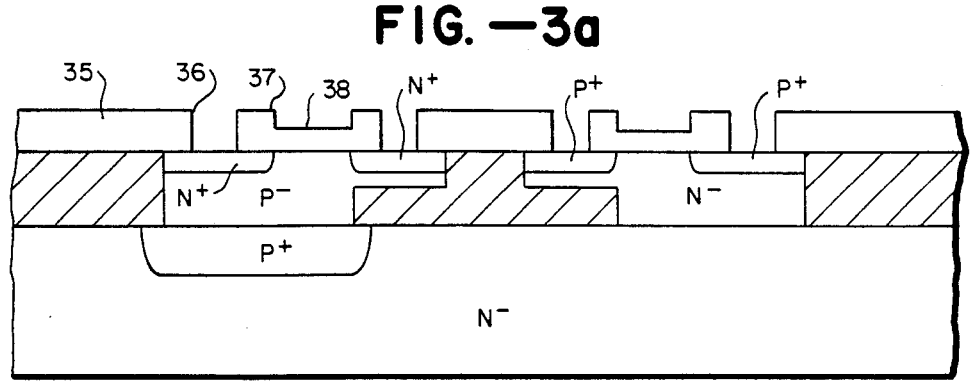
FIG.—3b
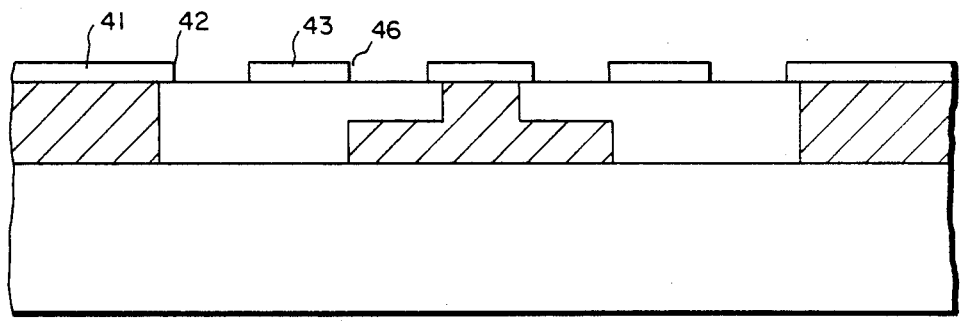
FIG.—4a
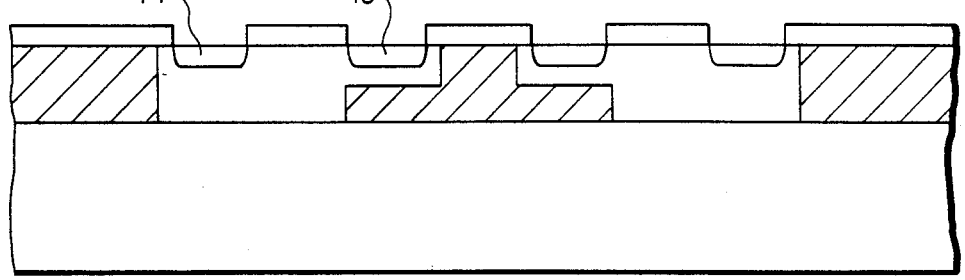
FIG.—4b

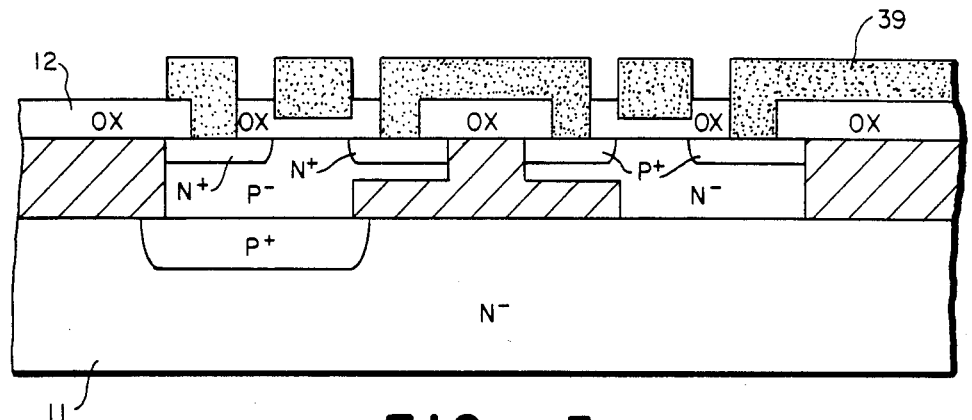
FIG.—5a
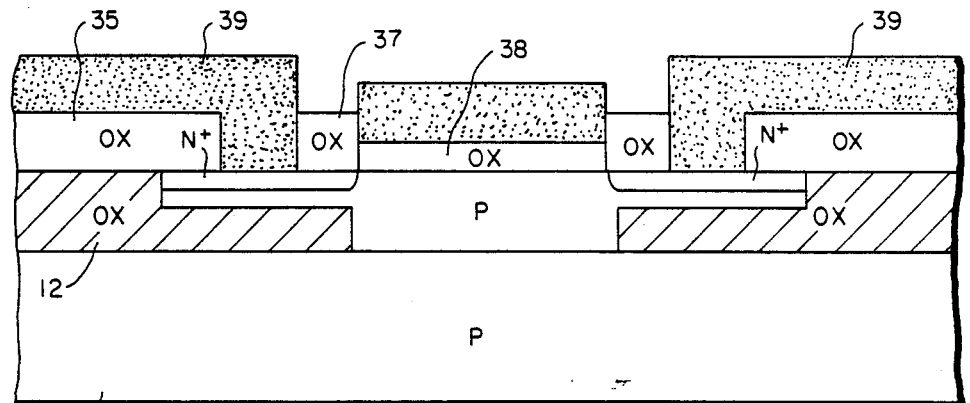
FIG.—5b
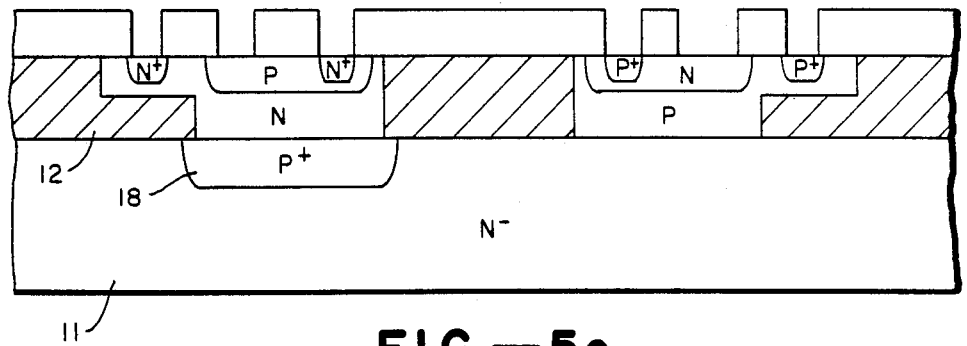
FIG.—5c

METHOD OF FORMING LOCALIZED EPITAXY AND DEVICES FORMED THEREIN

This invention relates generally to an integrated circuit structure and a process for forming that integrated circuit structure, which includes an epitaxial isolation structure for isolating circuit structures in closely packed integrated circuits.

It is well known that isolating transistors and other circuit elements, on an integrated circuit structure, is desirable and necessary for proper circuit performance. Prior art structures result in unintended circuit coupling and high parasitic capacitance to the silicon substrate. Implanted and diffused channel stops consume space and fail to effectively isolate circuit elements from capacitive noise. Oxidized grooves between circuit elements improve isolation, but are still limited in isolation capability and packing density.

It is a general object of the present invention to provide a method for forming integrated circuit elements with improved isolation and reduced capacitance in a densely packed integrated circuit.

The foregoing and other objects of the invention are achieved by a method of forming insulated epitaxial structures on a semiconductor substrate including a single crystal semiconductor region and a maximum isolation region that overlays a partially etched insulating layer.

FIG. 1 is a sectional view of a pair of epitaxial isolation structures.

FIGS. 2a-f are sectional views of the initial steps in the method for forming an isolated integrated circuit structure.

FIGS. 3a-b are sectional views of the steps for constructing a CMOS pair on the isolation structures using a non-self-aligning process.

FIGS. 4a-b are sectional views of the steps for constructing a CMOS pair on the isolation structure using a self-aligning process.

FIGS. 5a-c are sectional views schematically illustrating the epitaxial isolation structure with a CMOS circuit structure, a single N-channel MOS device, and a pair of bipolar transistors constructed thereon, respectively.

Referring to FIG. 1, a pair of epitaxial semiconductor isolation structures is shown on a silicon wafer body 11. While the preferred embodiment uses silicon substrate, the general method applies equally well to other semiconductor materials. The central portion 14 of the isolation structure is single crystal silicon, suitable for forming a bipolar transistor junction, an IGFET (insulated gate field effect transistor) channel, or other integrated circuit structure. The side portion 15 of the isolation structure, laying on top of the insulatory layer is polysilicon. The exact location of the boundary line between the single crystal growth and the polysilicon will depend on details of the process used. The depth of the epitaxial layer is defined by the height of the surrounding insulatory layer 12. A typical depth is 15,000 angstroms (Å). The polysilicon side portion 15 of the isolation structure is typically 10,000 angstroms thick on top of 5,000 angstroms of insulator 17.

The insulatory layer (12, 17) provides both side wall and substrate isolation. It guards against interdevice coupling using a minimum of space. Devices may be placed three microns apart with virtually complete isolation. In IGFET implementations, placing the drain, or both the source and drain, in the side region 15 minimizes both device substrate coupling and interdevice coupling. In bipolar implementations the side region 15 can be used to provide maximum isolation for the collector.

The initial fabrication steps are shown in FIGS. 2a-f. As shown in FIG. 2a the process begins with a silicon wafer 11 ready for processing. The figures shown assume that the silicon wafer 11 is initially doped N-type. If a P-type body is used, simply reverse the conductivities of the regions shown in the following description. The first step is to form an insulatory layer 12 approximately 15,000 angstroms deep. This layer may be oxide, a sandwich of oxide and nitride, or other insulatory material. The insulatory layer 12 is then patterned and etched so that the insulatory layer is removed wherever epitaxial silicon is to be grown.

The order of the next two processing steps, the results of which are shown in FIG. 2b, is not critical. The two steps are: (1) introducing impurity into some or all of the apertures 13; and (2) partially etching the insulatory layer 12 in certain regions adjacent to the apertures in the insulatory layer. The purpose of the first step is to create a highly doped "plug" 18 that will prevent the operation of parasitic transistors and SCRs. Thus the impurity must have the opposite conductivity as the background impurity in the silicon wafer 11. This step may be unnecessary if the background doping of the epitaxial layer is high enough and/or the use of the device is such that parasitic transistor or SCR action is insignificant. The second step defines the maximum isolation region 15 where polysilicon will be deposited later. The insulator is patterned to a thickness of approximately 5,000 angstroms in this region. This leaves a 10,000 angstrom deep pocket or offset where silicon will be deposited for the formation of an IGFET drain, bipolar collector or similar structure. The order of these two steps is interchangeable because the same structure results from either sequence.

Where variations in the voltage level of the parasitic plug 18 will or could degrade circuit performance it is advantageous to tie such plugs 18 to a steady voltage source. Normally the P-type plugs 18 in an N-type body 11 could be tied to the lowest voltage used in the circuit to ensure that the P-N junctions associated with the plugs are back-biased. Using the structure in FIG. 2b, tying each plug 18 to a voltage source is extremely inconvenient. Thus if the plugs are to be tied to a voltage source the order of the first three steps is reversed as follows.

As shown in FIG. 2e, the first step would be masking 22 or definition of the plug areas on the silicon surface 23 and introducing impurity into the defined areas to form the plug 18. Any of several conventional techniques may be used for doing this. Advantageously, all plug regions can be formed in one diffusion step and can be interconnected by diffused interconnect lines. Then, as shown in FIG. 2f, there is formed insulatory layer 12, approximately 15,000 angstroms deep, as described above. The insulatory layer 12 is then patterned and etched so that the insulatory layer is removed wherever epitaxial silicon is to be grown. Finally the maximum isolation regions 15 are formed by partially etching the insulatory layer 12 in certain regions adjacent to the apertures in the insulatory layer.

Thus the structure is now basically similar to that shown in FIG. 2b except that the plug 18 may be interconnected with other similar plugs elsewhere in the structure (not shown). As the circuit structure is completed it will be relatively easy to connect each plug area to the appropriate voltage source because only one connection need be made to each electrically common plug area.

The remaining fabrication steps are the same regardless of when, or if, the parasitic plug 18 was formed. FIG. 2c shows the structure after the deposition of a layer of silicon 21 on the surface. The epitaxial layer is deposited so as to be single crystal over the areas of exposed silicon 14 and polycrystalline elsewhere 15.

After the deposition of silicon 21, the silicon is removed in the areas where the thick oxide 12 remains by either mechanical polishing or chemical photoetching. See FIG. 2d.

Depending on the depth of the isolation structure and the geometry of the device to be formed in it, it may be necessary or desirable to expand the region of the structure occupied by single crystal silicon rather than polysilicon. Annealing may be employed to convert some or all of the polysilicon in the isolation structure into single crystal silicon. The epitaxial single crystal silicon that was grown on the original wafer surface provides the seed crystal needed for the propagation of the single crystal structure. Laser or other radiation means may be used to accomplish the annealing.

If the device being made needs both P-type and N-type isolation structures, then those areas which need background doping of opposite polarity to that of the deposited silicon are patterned and doped accordingly. Typically, the background doping of the deposited silicon will be of the same polarity as that of the silicon body, but several considerations could dictate otherwise. For instance, if only devices of one type are to be fabricated (e.g., N-channel MOS), then the deposited layer of silicon should be already doped the proper polarity for such devices (e.g., a P-type deposition for N-channel MOS devices).

The isolation structure is now ready for the formation of an integrated circuit structure. The epitaxial single crystal silicon 14 is an appropriate medium for both bipolar and IGFET structures, and the polysilicon isolation pocket 15 is appropriate for circuit nodes requiring maximum isolation and minimum parasitic capacitance.

To form a CMOS pair, one may use either a self-aligning or non-self-aligning process. The non-self-aligning process is shown in FIGS. 3a-3b. First, source (31, 34) and drain (32, 33) regions are defined and doped with impurities. See FIG. 3a. Then a thick oxide or other insulator 35 is formed, the gate is etched out 37, a gate oxide 38 is formed and contact holes 36 are etched for the source and drain. See FIG. 3b. Thereafter metal 39 is deposited for both gate and interconnect. See FIG. 5a. The source areas (31, 34) are typically tied to a steady voltage source and thus do not need special isolation protection. The drain areas (32, 33), on the other hand, typically experience quick and frequent voltage changes. Thus the drain areas are most in need of isolation and are located in the silicon layer 15 residing above the partially etched insulatory layer 17.

A self-aligning process is shown in FIGS. 4a-b. First the gate structure 43 is formed. For instance, this may involve the growth of a gate oxide followed by the deposition of polysilicon. Then the gate layer is patterned and etched, creating apertures (42, 46) for implanting source 44 and drain 45 regions. If both N-type and P-type channel devices are being made then the patterning and implanting will take more steps. (E.g., Define and etch source and drain for N-channel devices; implant; form protective nitride or oxide; define and etch source and drain for P-channel devices; implant.) Finally, the interconnect layer 39 is formed.

FIG. 5a shows a completed CMOS pair using the isolation structure described above. FIG. 5b shows a single N-channel MOS transistor where both source and drain require maximum isolation. FIG. 5c shows complementary bipolar transistors with collectors in the maximum isolation region.

There has been described a process or method for forming integrated circuit isolation structures. This method uses conventional processing techniques that require a minimum of additional cost over prior art, and yet provide a high degree of device isolation and density. There has also been described a semiconductor isolation structure, independent of the process for forming it. For CMOS device structures in particular this process and isolation structure will allow unprecedented circuit density and performance.

While the invention has been described with reference to a preferred embodiment, the description is illustrative of the invention and is not to be construed as limiting the invention. Various modifications and applications may occur to those skilled in the art without departing from the scope and spirit of the invention as defined by the appended claims.

What is claimed:

1. A method for forming an isolated integrated circuit structure comprising the sequential steps of:
    providing a silicon body having a surface;
    forming an insulatory layer on the surface having at least one aperture exposing a portion of the surface of said body;
    partially etching away the insulatory layer in at least one area adjacent to at least one of said apertures in said insulatory layer, said aperture and adjacent area together comprising a defined circuit area;
    depositing a layer of silicon on the surface such that the deposit on the exposed area of silicon is epitaxial single crystal silicon; and
    removing deposited silicon outside of said defined circuit area.

2. The method of claim 1 wherein the last step is followed by radiation annealing, said annealing transforming at least a portion of the polycrystalline silicon in the defined circuit area into single crystal silicon.

3. The method of claim 1 wherein the last step is followed by introducing into at least one of said defined circuit areas impurity of the opposite conductivity as the background impurity in said deposited layer of silicon.

4. The method of claim 1 wherein impurities are introduced through at least one of said apertures after the formation of said apertures but before the depositing of said layer of silicon, to form a parasitic transistor plug.

5. The method of claim 1 wherein the formation of said insulatory layer is preceded by defining on said surface at least one parasitic transistor plug area and introducing impurity of the opposite conductivity as the background impurity into each said defined plug area.

6. The method of claim 1 wherein the last step is followed by a series of device formation steps comprising:
    defining source and drain areas and introducing impurity into those portions of said device areas used for the source or drain of isolation gate field effect transistors (IGFETs), where said source or drain region or both in at least one device area is located in the silicon layer residing above the partially etched insulatory layer;

forming an insulatory gate layer of an appropriate thickness for an IGFET gate;

defining apertures in said insulatory gate layer for contacts to said source and drain areas, where the defined channel area is located in epitaxial single crystal silicon.

7. The method of claim 1 wherein the last step is followed by a series of device formation steps comprising:

defining a base area for a bipolar device in at least one of said device areas and introducing impurity into such defined base areas;

defining collector and emitter areas for a bipolar device and introducing impurity into such defined areas, wherein the bipolar transistor junction area is located in epitaxial single crystal silicon, and wherein the defined collector area is located in the silicon layer residing above the partially etched insulatory layer.

8. The method of claim 1 wherein the last step is followed by a self-aligning method of forming IGFETs comprising:

gate formation and definition;

source and drain area definition and impurity implanting in said source and drain areas.

9. A method for forming an isolated integrated circuit structure comprising the sequential steps of:

providing a silicon body having a surface;

forming an insulatory layer on the surface having at least one aperture exposing a portion of the surface of said body;

introducing impurity of opposite conductivity to the background impurity of said silicon body, through at least one of said apertures, to form a parasitic transistor plug;

partially etching away the insulatory layer in at least one area adjacent to at least one of said apertures in said insulatory layer, said aperture and adjacent area together comprising a defined circuit area;

depositing a layer of silicon on the surface such that the deposit on the exposed area of silicon is epitaxial single crystal silicon;

removing deposited silicon outside of said defined circuit area; and radiation annealing to transform at least a portion of the polycrystalline silicon in the defined circuit area into single crystal silicon.

10. A method for forming an isolated integrated circuit structure comprising the sequential steps of:

providing a semiconductor body having a surface;

forming an insulatory layer on the surface having at least one aperture exposing a portion of the surface of said body;

partially etching away the insulatory layer in at least one area adjacent to at least one of said apertures in said insulatory layer, said aperture and adjacent area together comprising a defined circuit area;

depositing a layer of semiconductor material on the surface such that the deposit on the exposed area of said semiconductor body is epitaxial single crystal semiconductor;

removing deposited semiconductor material outside of said defined circuit area.

11. The method of claim 10 wherein said forming step includes the forming of a plurality of apertures exposing the surface of said body; and further including the step of forming a plurality of IGFETs in said defined circuit areas, wherein a plurality of said IGFET devices have only one source/drain region formed in a region defined by an offset.

12. The method of claim 11 wherein said etching step includes the partial etching away, adjacent to a plurality of said apertures, of a single offset area, thereby forming a plurality of defined circuit areas having a single offset area.

* * * * *